(12) United States Patent
Summer

(10) Patent No.: US 8,072,726 B2
(45) Date of Patent: Dec. 6, 2011

(54) RADIATION-TOLERANT INRUSH LIMITER

(76) Inventor: Steven E. Summer, Shirley, NY (US)

( * ) Notice: Subject to any disclaimer, the term of this patent is extended or adjusted under 35 U.S.C. 154(b) by 183 days.

(21) Appl. No.: 10/936,140

(22) Filed: Sep. 7, 2004

(65) Prior Publication Data

US 2006/0082939 A1  Apr. 20, 2006

(51) Int. Cl.
*H02H 9/08* (2006.01)

(52) U.S. Cl. .......................... 361/93.9; 361/98

(58) Field of Classification Search ............. 361/58, 361/93.9, 98

See application file for complete search history.

(56) References Cited

U.S. PATENT DOCUMENTS

| | | | |
|---|---|---|---|
| 3,836,836 A | 9/1974 | Cowett, Jr. | |
| 4,008,441 A * | 2/1977 | Schade, Jr. | 330/288 |
| 4,757,433 A * | 7/1988 | Santelmann, Jr. | 363/19 |
| 4,900,693 A * | 2/1990 | Manning | 438/223 |
| 5,283,707 A * | 2/1994 | Conners et al. | 361/58 |
| 5,519,264 A * | 5/1996 | Heyden et al. | 307/125 |
| 6,807,039 B2 * | 10/2004 | Priest | 361/93.1 |
| 2003/0076638 A1 * | 4/2003 | Simonelli et al. | 361/56 |

* cited by examiner

*Primary Examiner* — Rexford Barnie
*Assistant Examiner* — Christopher Clark
(74) *Attorney, Agent, or Firm* — Feldman Law Group, P.C.; Stephen E. Feldman; Steven M. Crosby

(57) ABSTRACT

A radiation-tolerant inrush limiter is provided. The inrush limiter does not incorporate radiation-hardened parts, but instead uses an ordinary (non-hardened) p-channel FET to provide switching functionality.

9 Claims, 1 Drawing Sheet ature-tolerant inrush limiter with non-hardened parts.

BACKGROUND OF THE INVENTION

Inrush limiting circuits are commonly used in conjunction with DC-DC converters. DC-DC converters usually incorporate large value capacitors in parallel with their input terminals for filtering purposes. If input voltage is suddenly applied to the power supply, inrush currents flow from the power source to charge the input capacitance. Inrush current limiters are circuits that control the rise time of the applied input voltage, thereby limiting the inrush current that flow upon application of power to tolerable levels.

In many applications, it is also desirable or mandated that no output should be produced by the power supply until and unless the input voltage is sufficiently high. Since DC-DC converters are regulating devices, for a constant output load, input current increases inversely proportional to input voltage. Therefore, by inhibiting production of output power from the power supply until the input voltage is above a sufficient level, the input current magnitude at low input voltages is controlled. This often prevents a damaging condition.

DC/DC converters are electronic devices that use switching components, such as field effect transistors (FETs) to transform voltage from one level to another. Typically, the output voltage is regulated and protected against short circuits. In many cases, the input and output potentials are galvanically isolated from each other.

In an FET, current flows along a semiconductor path called the channel. At one end of the channel, there is a source electrode, and at the other end, a drain electrode. The physical diameter of the channel is fixed, but its effective electrical diameter is changed by applying voltage to a gate electrode. The conductivity of the FET depends, at any given time, on the electrical diameter of the channel. A small change in gate voltage can cause a large variation in current from the source to the drain. In this way, the FET switches current on or off.

Typically, FETs used for power switching are enhancement mode types, that is, they are normally non-conducting. When a gate voltage above a certain threshold is applied, the FET becomes conducting. Such FETs are used to control current flow and are available in two gate polarities; N channel and P channel.

Among many applications, inrush limiters are used in spacecraft, satellites and in high energy physics instrumentation where they are subjected to many forms of radiation damage. When electrical components are exposed to radiation, they behave differently. For example, when an N channel FET is exposed to relatively low radiation levels, the gate threshold voltage ultimately falls close to zero. In this condition, the FET conducts current with little or no applied gate voltage. In other words, the FET is uncontrollable because the current running through the channel cannot be shut off.

Inrush limiters designed for general purpose use are typically constructed with N channel FETs because, for any given die size transistor, the N channel FET has a lower on resistance than a correspondingly sized P channel FET.

To use electrical components in high radiation environments, they are radiation-hardened to withstand the damage caused by radiation. The radiation hardening process usually involves removing or adding some specific element or ions to the materials used for making the components. Being radiation hardened, the gate threshold voltage experiences minimal change after exposure to radiation. One method for chemically radiation hardening DC/DC converters is disclosed in U.S. Pat. No. 3,836,836 to Cowett, Jr. (Cowett).

Radiation-hardened components, however, have limited sources, are expensive and take a long time to produce, creating higher prices and longer delivery times for the radiation tolerant circuits that incorporate the hardened materials. It is desirable, therefore, to provide electrical components with ordinary (non-hardened) materials that can function when exposed to radiation.

SUMMARY OF THE INVENTION

A radiation-tolerant inrush limiter is provided. The inrush limiter does not incorporate radiation-hardened parts, but instead uses an ordinary (non-hardened) p-channel FET to provide switching functionality.

In further detail, the present invention provides a radiation-tolerant electrical component for limiting inrush currents in radiation-intensive applications. The component comprises a common line, a load input line, a positive input line, a voltage lockout circuit, and a non-hardened p-channel FET having a drain, a gate, and a source. The common line is operably connected to the gate, the load input line is operably connected to the drain, the positive input line is operably connected to the source, and the voltage lockout circuit is operably connected to the gate.

In accordance with further aspects of the preferred embodiment, the voltage lockout circuit further comprises a current-limiting resistor, a first voltage divider resistor, a second voltage divider resistor, a first and second pull-up resistor, and a bias current resistor, all connected to the common line. In addition, an under-voltage-lockout-PNP transistor has a first PNP connection that is connected to the second collector pull-up resistor, a second PNP connection that is connected to the bias-current resistor and an under-voltage-lockout-reference-zener diode, and a third PNP connection that is connected to a first voltage divider resistor.

DETAILED DESCRIPTION

Figure 1:
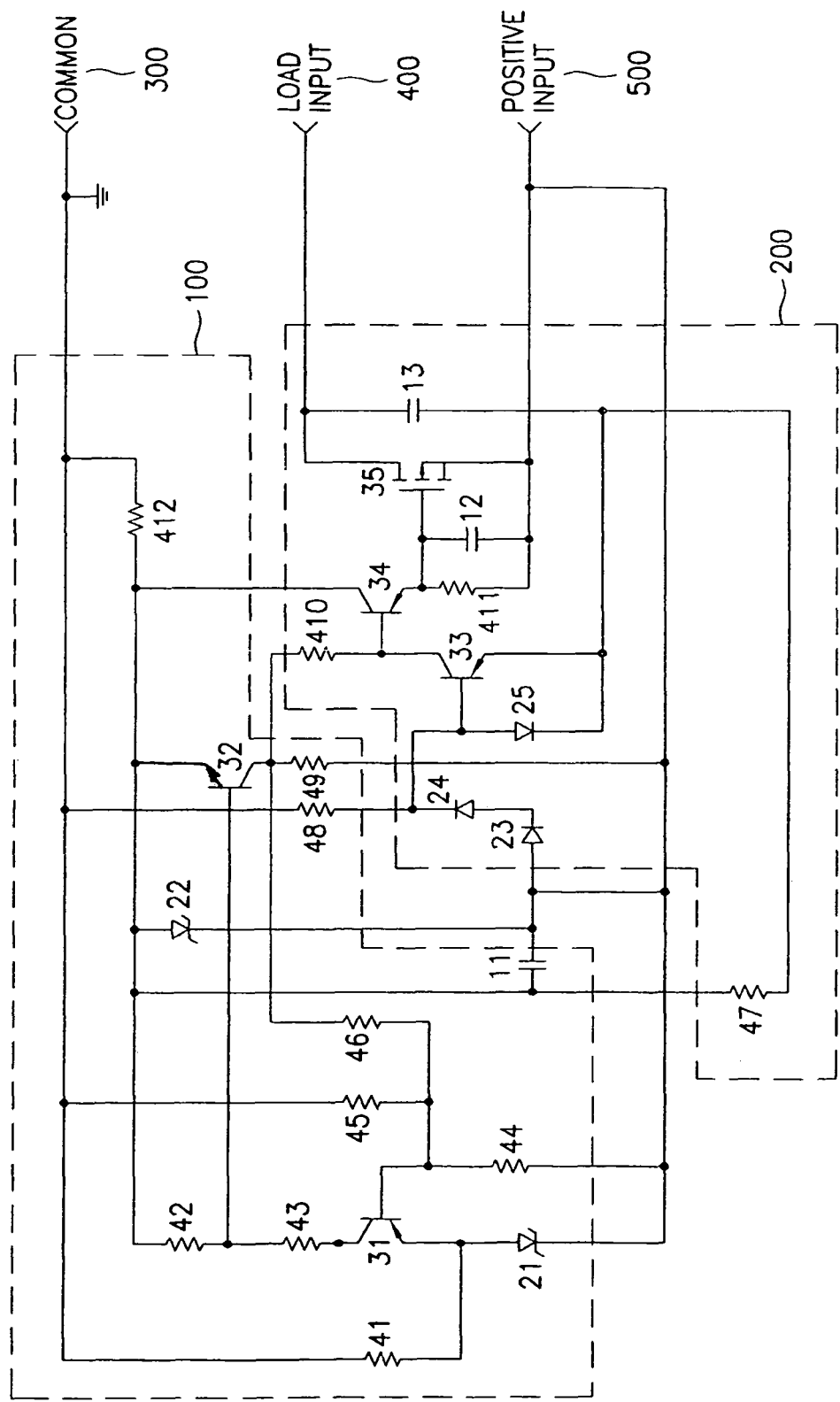
FIG. 1 is a schematic wiring diagram of a radiation-tolerant inrush limiter in accordance with an embodiment of the present invention.

Field-effect transistors exist in two major classifications, the junction FET (JFET) and the metal-oxide-semiconductor FET (MOSFET). A MOSFET is a special type of FET that works by electronically varying the width of a channel along which charge carriers (electrons or holes) flow. Wider channels provide better conductivity. The charge carriers enter the channel at the source, and exit via the drain. The width of the channel is controlled by the voltage on an electrode called the gate, which is located physically between the source and the drain and is insulated from the channel by an extremely thin layer of metal oxide.

There are two ways in which a MOSFET can function. The first is known as depletion mode. When there is no voltage on the gate, the channel exhibits its maximum conductance. As the voltage on the gate increases (either positively or negatively, depending on whether the channel is made of P-type or N-type semiconductor material), the channel conductivity decreases. The second mode of MOSFET operation is called enhancement mode. When there is no voltage on the gate, there is in effect no channel, and the device does not conduct. A channel is produced by the application of a voltage to the gate. Increasing gate voltage increases conductivity and thus, current flow.

The MOSFET has certain advantages over the conventional junction FET, or JFET because the gate is insulated electrically from the channel. No current flows between the gate and the channel, regardless of the gate voltage (as long as it does not become so great that it causes physical breakdown of the metallic oxide layer). Thus, the MOSFET has practically infinite impedance.

When conventional non-radiation hardened N Channels FETs are used in applications where radiation is present, the FETs become uncontrollable at relatively low radiation levels because the gate threshold voltage of the N channel FET experiences a negative shift, and ultimately falls close to zero. At that point, the N channel FET conducts current with little or no gate voltage applied making it uncontrollable, like a flood gate that cannot be closed.

The gate threshold voltage of a conventional, non-radiation hardened P channel FET also shifts negatively with radiation exposure. However, the initial threshold voltage of an ordinary P channel FET is negative to begin with. In the presence of radiation, therefore, the gate threshold voltage does not approach zero and therefore will not become uncontrollable. The gate threshold voltage does change, but from a negative value to a more negative value. Conventional P channel FETs, therefore, are more robust to total radiation dose effects as compared to conventional N channel FETs when the proper gate drive signal is provided.

In accordance with an embodiment of the present invention, the gate drive signal should be high enough to saturate the drain to source channel. It should not, however, be so high that the gate to source breakdown voltage rating of the FET is exceeded. Preferably, the FET operates close to its maximum gate voltage signal. Higher signals can handle higher radiation levels, allowing the FET to function across a larger range of radiation exposure.

FIG. 1 is a schematic diagram for a circuit according to a preferred embodiment of the present invention. This particular example operates from a voltage source of 22 VDC to 50 VDC, but nominally 28 VDC. It may, however, be readily scaled for different bus voltages. The circuit consists of an under voltage lockout portion indicated by dashed line 100, and an inrush limiter portion indicated by dashed line 200. A common line 300, a load input line 400, and a positive input line 500 are all operably connected to the circuit. The common line 300 carries the output of the circuit and the other lines 100, 200 carry the input to the circuit.

For the under voltage lockout portion 100, under-voltage-lockout-voltage reference-zener diode 21 acts as a voltage reference for the under voltage lockout. The diode 21 and the base emitter junction of the under-voltage-lockout-PNP-bipolar transistor 31 form a voltage reference. Bias-current-resistor 41 supplies a minimum, or bias current through the reference-diode 21 to stabilize its zener operation. The diode 22 is operably connected to a filter capacitor 11.

A first-voltage-divider-resistor 44 and second-voltage-divider-resistor 45 form a voltage divider that senses the bus voltage and determines the operating point of the under voltage lockout function.

A first-collector-pull-up-resistor 42 and second-collector-pull-up-resistor 43 act as the collector pull up for the transistor 31. The common connection of resistors 42 and 43 drives the base of the under-voltage-lockout-circuit-NPN-bipolar transistor 32.

Feeding-current-limiting-resistor 412 limits the current fed to the drive-circuit-stabilizing-zener diode 22 that establishes a stabilized internal voltage with reference to the positive bus voltage.

A first-collector-load-resistor 49 is a collector pull-up for the NPN transistor 32. A hysteresis resistor 46 provides a hysteresis action to the operation of the transistor 31, to prevent intermediate state operation.

When the bus voltage exceeds the desired minimum (approximately 22 VDC in this example), the under-voltage-lockout-NPN-bipolar transistor 32 conducts and applies voltage to one end of a second-collector-load-resistor 410. This allows the inrush limiter portion 200 to operate.

The inrush limiter portion 200 consists of a common-base-amplifier-PNP-bipolar transistor 33 and a gate-drive-voltage-buffer-PNP-bipolar transistor 34 as well as a P-channel FET 35. The common-base-amplifier-PNP-bipolar transistor 33 is used as a common base amplifier and the gate-drive-voltage-buffer-PNP-bipolar transistor 34 is used to buffer the gate drive voltage to the P channel MOSFET 35.

A first-reference-voltage diode 23 and a second-reference-voltage diode 24 establish a reference voltage for the common-base-amplifier-PNP-bipolar transistor 33. The established reference voltage is slightly more negative than the input bus. Diodes 23 and 24 are connected to the return leg of the input bus through bias-current resistor 48. The purpose of these components is to establish a bias voltage for the base of the common-base-amplifier-PNP-bipolar transistor 33 that should be two diode drops more negative than the positive bus voltage.

The common-base-amplifier-PNP-bipolar transistor 33 provides a non-inverting stage of voltage gain. The collector load resistor for the transistor 33 is the second-collector-load-resistor 410.

A reverse-voltage-limiting diode 25 limits the reverse voltage across the base emitter terminal of the common-base-amplifier-PNP-bipolar transistor 33.

A gate-drive-voltage-buffer transistor 34 is a PNP bipolar transistor that acts as an emitter follower, lowering the impedance of the signal on the collector of the common-base-amplifier-PNP-bipolar transistor 33.

A gate-to-source-filter resistor 411 and a current-limiting-resistor 412 act as filter components across the gate-source terminals of the MOSFET 35. A noise-filter-decoupling capacitor 12 is connected across the filter resistor 411.

When bus power is applied, the drain voltage of the MOSFET 35 is initially at ground potential. As the MOSFET 35 conducts and its drain voltage rises, current flows through a timing capacitor 13. Most of this current flows through a timing resistor 47, however a small current flows into the emitter of the MOSFET 33.

Since the emitter voltage of the MOSFET 33 should be constant at approximately 1.8 VDC below the positive rail, the current through the timing resistor 47 is relatively constant during the turn-on interval. Therefore, the current through the timing capacitor 13 should be relatively constant as well. The relatively constant current through the timing capacitor 13 establishes a relatively linear ramp voltage across it.

Therefore, the output voltage at the drain terminal of the MOSFET 35 rises from zero to the positive bus voltage in a linear manner. By controlling the turn on rise time of the MOSFET 35, inrush current flowing into downstream capacitors is determined and controlled.

This circuit provides a relatively constant power rise time to the load, essentially independent of the gate to source threshold voltage of the P channel FET 35. Since the gate to source threshold voltage of the FET 35 changes considerably as a result of exposure to ionizing radiation, this circuit produces a relatively uniform power application rise time to the load, despite the parametric changes due to radiation.

In the preceding specification, the invention has been described with reference to specific exemplary embodiments thereof. It will however, be evident that various modifications and changes may be made thereto without departing from the broader spirit and scope of the invention as set forth in the claims that follow. The specification and drawings are accordingly to be regarded in an illustrative manner rather than a restrictive sense.

What is claimed is:

1. A radiation-tolerant electrical component for limiting inrush currents in radiation-intensive applications, the component comprising:
    a common line,
    an load input line;
    an positive input line;
    an inrush limiter comprising a non-hardened p-channel FET having a drain, a gate, and a source, wherein the source is operably connected to the positive input line, the drain is operably connected to the load input line, the FET providing controlled electrical response to the load input line when exposed to radiation,
    a gate-drive-voltage-buffer transistor operably connected across a negative bias supply referenced to the positive input line and the gate,
    a common-base-amplifier transistor operably connected, across the load input and the gate drive-voltage-buffer transistor,
    wherein the non-hardened p-channel FET has an initial negative gate threshold voltage that changes to a more negative value in the presence of radiation and said FET operates close to its maximum gate voltage range so said FET can function over a large range of radiation exposure, said FET has a gate drive signal high enough to saturate the drain to source channel but not so high that a gate to source breakdown voltage rating of the FET is exceeded, a voltage lockout circuit operatively connected between the positive input line and to a collector load resistor of the common base amplifier which drives said FET, where the voltage lockout circuit applies voltage to the common-base-amplifier and gate-drive-voltage-buffer which drives the gate of said FET when the input carries a predetermined-minimum input voltage to permit said inrush limiter to operate.

2. The electrical component of claim 1 wherein the voltage lockout circuit further comprises:
    a current-limiting resistor, first voltage divider resistor, a second voltage divider-resistor, first and second pull-up resistor, a bias current resistor operably connected to the common line;
    an under-voltage-lockout-PNP transistor have a first PNP connection operably connected to the second pull-up resistor and an under-voltage-lockout reference-zener diode, and a third PNP connection operably connected to the first voltage divider resistor.

3. The electrical component of claim 2 further comprising an under-voltage-lockout-NPN-transistor having:
    a first NPN connection operably connected to the current limiting resistor,
    a second NPN connection operably connected to the first and second collector-pull-up resistor; and
    a third NPN connection operably connected to the an inrush limiting circuit.

4. The electrical component of claim 1 further comprising a gate to source filter resistor operably connected across the gate and source.

5. A radiation-tolerant electrical component for limiting inrush currents in radiation-intensive applications, the component comprising:
    a common line;
    a load input line;
    a positive input line;
    a voltage lockout circuit;
    an inrush limiting circuit with a non-hardened p-channel FET having a drain, a gate, and a source;
    a gate-drive-voltage-buffer transistor operably connected across a negative bias supply referenced to the positive input line and the gate,
    a common-base-amplifier transistor operably connected, across the load input and the gate-drive-voltage-buffer transistor,
    wherein the gate-drive-voltage-buffer transistor is operably connected to the gate;
    the load input line is operably connected to the drain;
    the positive input line is operably connected to the source;
    the voltage lockout circuit is operably connected to the common base amplifier and the gate drive voltage buffer transistor, wherein the non-hardened p-channel FET has an initial negative gate threshold voltage that changes to a more negative value in the presence of radiation and said FET operates close to its maximum gate voltage range so said FET can function over a large range radiation exposure and said FET has a gate drive signal high enough to saturate the drain to source channel but not so high that a gate to source breakdown voltage rating of the FET is exceeded, the voltage lockout circuit enables the application of gate voltage to the FET when the input carries a predetermined-minimum input voltage to permit said inrush limiting circuit to operate.

6. The electrical component of claim 5 where in the inrush limiting circuit further comprises a reference voltage diode operably connected between the common-base-amplifier transistor and the positive input line.

7. The electrical component of claim 5 wherein the inrush limiting circuit further comprises a reverse-voltage-limiting diode operably connected between the common-base-amplifier transistor and the load input line.

8. The electrical component of claim 5 where in the inrush limiting circuit further comprises a gate-to-source-filter-resistor operably connected between the gate and source.

9. The electrical component of claim 5 where in the inrush limiting circuit further comprises a noise-filter-decoupling capacitor operably connected between the gate and source.

\* \* \* \* \*